United States Patent
Sueyoshi et al.

(10) Patent No.: US 6,883,840 B2
(45) Date of Patent: Apr. 26, 2005

(54) VEHICLE OUTER HANDLE SYSTEM

(75) Inventors: Masahiko Sueyoshi, Miyazaki (JP); Shigeru Kamei, Miyazaki (JP); Kazuo Yuhi, Miyazaki (JP); Suguru Asakura, Saitama (JP); Akira Kamikura, Wako (JP); Kentaro Yoshimura, Wako (JP); Kiyomitsu Ishikawa, Tokyo (JP); Kazuhiko Sugimura, Tokyo (JP)

(73) Assignees: Kabushiki Kaisha Honda Lock, Miyazaki (JP); Honda Giken Kogyo Kabushiki Kaisha, Tokyo (JP); Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 10/102,329

(22) Filed: Mar. 19, 2002

(65) Prior Publication Data

US 2002/0152582 A1 Oct. 24, 2002

(30) Foreign Application Priority Data

Mar. 28, 2001 (JP) ........................ 2001-093166

(51) Int. Cl.$^7$ ................................ E05B 3/00
(52) U.S. Cl. .............. 292/336.3; 292/92; 292/DIG. 65; 70/262; 70/266; 16/412; 340/425.5
(58) Field of Search ................. 292/92, 336.3, 292/DIG. 65, DIG. 59; 16/412; 340/425.5, 426.1, 541, 542; 70/262–266, 92; B62B 1/00

(56) References Cited

U.S. PATENT DOCUMENTS

| | | | | |
|---|---|---|---|---|
| 1,165,436 A | * | 12/1915 | Mochau ........................ 292/93 |
| 3,777,423 A | * | 12/1973 | Coulter et al. ................. 49/31 |
| 4,722,025 A | * | 1/1988 | Robinson .................... 361/212 |
| 4,871,204 A | * | 10/1989 | Cook et al. ............... 292/251.5 |
| 4,904,005 A | * | 2/1990 | Frolov ..................... 292/251.5 |
| 5,297,010 A | * | 3/1994 | Camarota et al. ........... 362/501 |
| 5,615,918 A | * | 4/1997 | Ferrell ......................... 292/92 |
| 5,864,062 A | * | 1/1999 | Nagahara et al. ........ 73/514.01 |
| 5,864,063 A | * | 1/1999 | Otani et al. .............. 73/514.32 |
| 5,880,538 A | * | 3/1999 | Schulz ....................... 307/109 |
| 6,075,294 A | * | 6/2000 | Van den Boom et al. . 307/10.1 |
| 6,239,693 B1 | * | 5/2001 | Benard et al. ......... 340/426.26 |
| 6,283,514 B1 | * | 9/2001 | Letzel ......................... 292/142 |
| 6,367,295 B1 | * | 4/2002 | Agostini et al. .............. 70/257 |
| 6,527,316 B1 | * | 3/2003 | Agostini et al. ............ 292/347 |
| 6,588,813 B1 | * | 7/2003 | Marcarini et al. .......... 292/347 |
| 6,639,161 B2 | * | 10/2003 | Meagher et al. ......... 200/61.73 |
| 6,657,537 B1 | * | 12/2003 | Hauler ..................... 340/5.62 |
| 2003/0101781 A1 | * | 6/2003 | Budzynski et al. ........... 70/239 |
| 2003/0107473 A1 | * | 6/2003 | Pang et al. ................. 340/5.72 |

FOREIGN PATENT DOCUMENTS

| | | | |
|---|---|---|---|
| DE | 3621592 | * | 2/1987 |
| DE | 4435894 | * | 11/1996 |
| DE | 196 17 038 A1 | | 11/1997 |
| EP | 1 006 028 A2 | | 6/2000 |
| EP | 1 235 190 A1 | | 8/2000 |
| JP | 10308149 | | 11/1998 |
| JP | 10-308149 | | 11/1998 |
| WO | WO 02 33203 A | | 4/2002 |

* cited by examiner

*Primary Examiner*—Daniel P. Stodola
*Assistant Examiner*—Carlos Lugo
(74) *Attorney, Agent, or Firm*—Carrier, Blackman & Associates, P.C.; Joseph P. Carrier; William D. Blackman

(57) ABSTRACT

A vehicle outer handle system includes a handle main body formed from a synthetic resin and having a hollow grip part, and an electrode for detecting a change in capacitance. One end of the handle main body is swingably supported in a door outer panel, and the electrode is housed within the grip part. A grounded electrostatic shield plate is disposed with the grip part outwardly of the electrode, thereby preventing an erroneous determination of a user's intention of opening the door.

17 Claims, 2 Drawing Sheets

VEHICLE OUTER HANDLE SYSTEM

BACKGROUND OF THE INVENTION

1. Technical Field of the Invention

The present invention relates to a vehicle outer handle system wherein one end of a handle main body formed from a synthetic resin and having a hollow grip part is swingably supported in a door outer panel, and an electrode for detecting a change in capacitance is housed within the grip part.

2. Discussion of Relevant Art

It is known to use an outer handle system of a vehicle door to obtain a trigger signal by which a user's intention to open the door is confirmed and an operation to unlock the locked door is carried out, when automatically releasing a locked door in response to identification of a vehicle user by the transmission/reception of a user identification code between a portable transceiver carried by the user and a vehicle transceiver disposed on the vehicle. Such an outer handle system is disclosed in, for example, Japanese Patent Application Laid-open No. 10-308149.

In the known outer handle system, the user's intention to open the door is confirmed based on an increase in the capacitance between ground and an electrode housed within the grip part of a handle main body when the user's hand touches or approaches the grip part, compared with when the grip part is not touched or approached. In the above-mentioned conventional system, since the electrode within the grip has sensitivity on both the inside and the outside of the grip part, the capacitance is increased by direct contact of a human hand with the outside of the grip part or by indirect contact of a human body via clothes, a glove, etc. with the outside of the grip part. As a result, it might be erroneously recognized that the user has the intention of opening the door, and an operation to unlock a locked door might be carried out erroneously.

SUMMARY OF THE INVENTION

The present invention has been carried out in view of the above-mentioned circumstances, and it is an object of the present invention to provide a vehicle outer handle system that can correctly recognize a user's intention to open a door.

In order to achieve the above-mentioned object, in accordance with the present invention, there is provided a vehicle outer handle system that includes a handle main body and an electrode for detecting a change in capacitance, the handle main body being formed from a synthetic resin and including a grip part, one end of the handle main body being swingably supported in a door outer panel, the electrode being housed within the grip part, and a grounded electrostatic shield plate disposed with grip part outwardly of the electrode.

In accordance with the above-mentioned arrangement, the electrostatic shield plate, which is disposed outwardly of the electrode housed within the grip part, can prevent any increase in the capacitance between the electrode and ground when the outside of the grip part is directly touched by a human hand or is touched by a human body via clothes, a glove, etc. so that the capacitance does not increase unless a user who has the intention of opening the door touches the inside of the grip part, thereby allowing the user's intention to open the door to be recognized correctly.

Preferably the grip part is hollow, the vehicle outer handle system further includes a retaining member disposed within the grip part, and the electrode and the electrostatic shield plate are disposed on opposite surfaces of said retaining member.

Modes for carrying out the present invention are explained below by reference to one embodiment of the present invention illustrated in the attached drawings.

BRIEF DESCRIPTION OF THE DRAWINGS

FIG. 1 is a side view of one outer part of a vehicle door including a handle.

FIG. 2 is a cross section at line 2—2 in FIG. 1.

DETAILED DESCRIPTION OF PREFERRED EMBODIMENT

Figure 1:
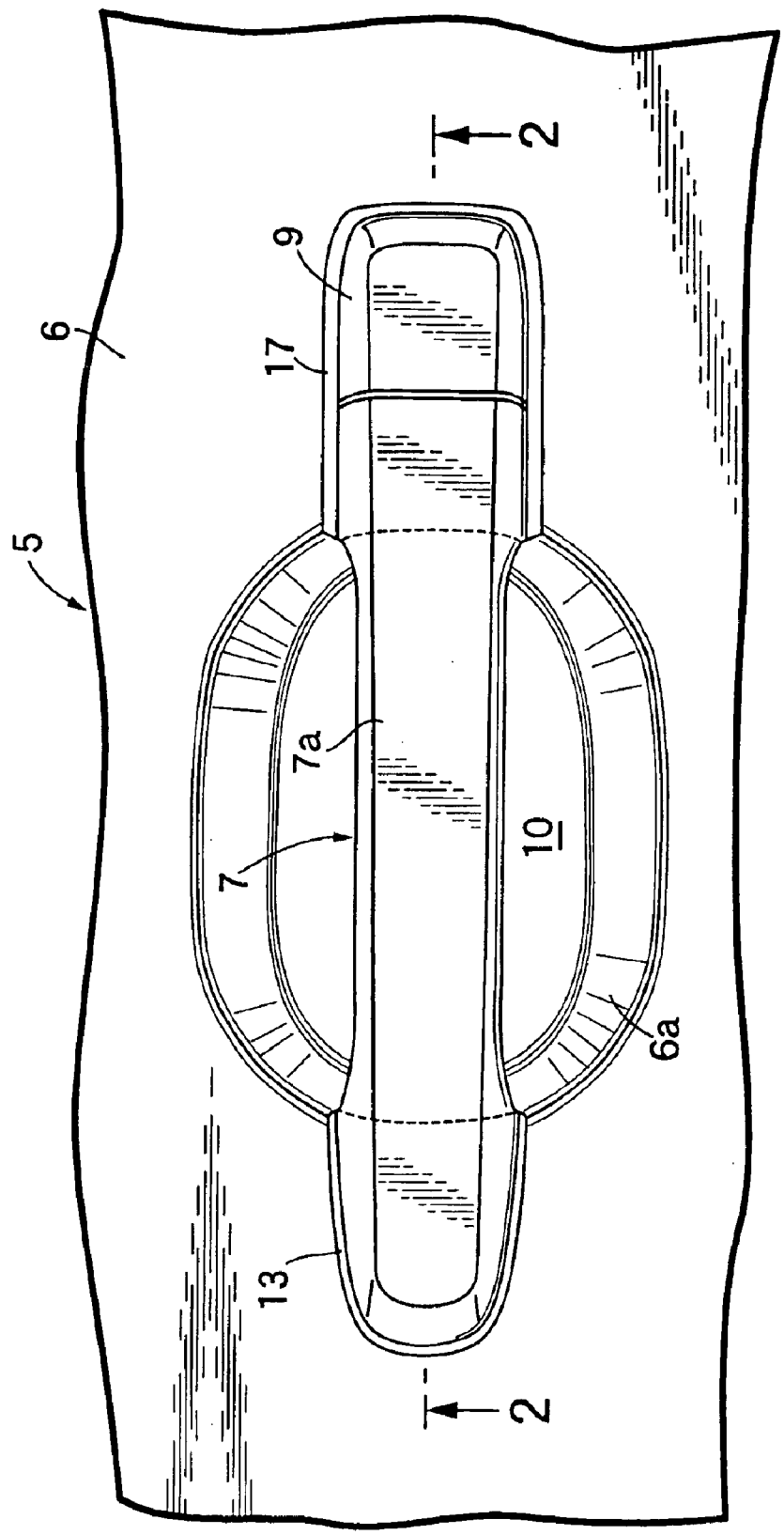
FIGS. 1 and 2 show one embodiment of the present invention.
Figure 2:
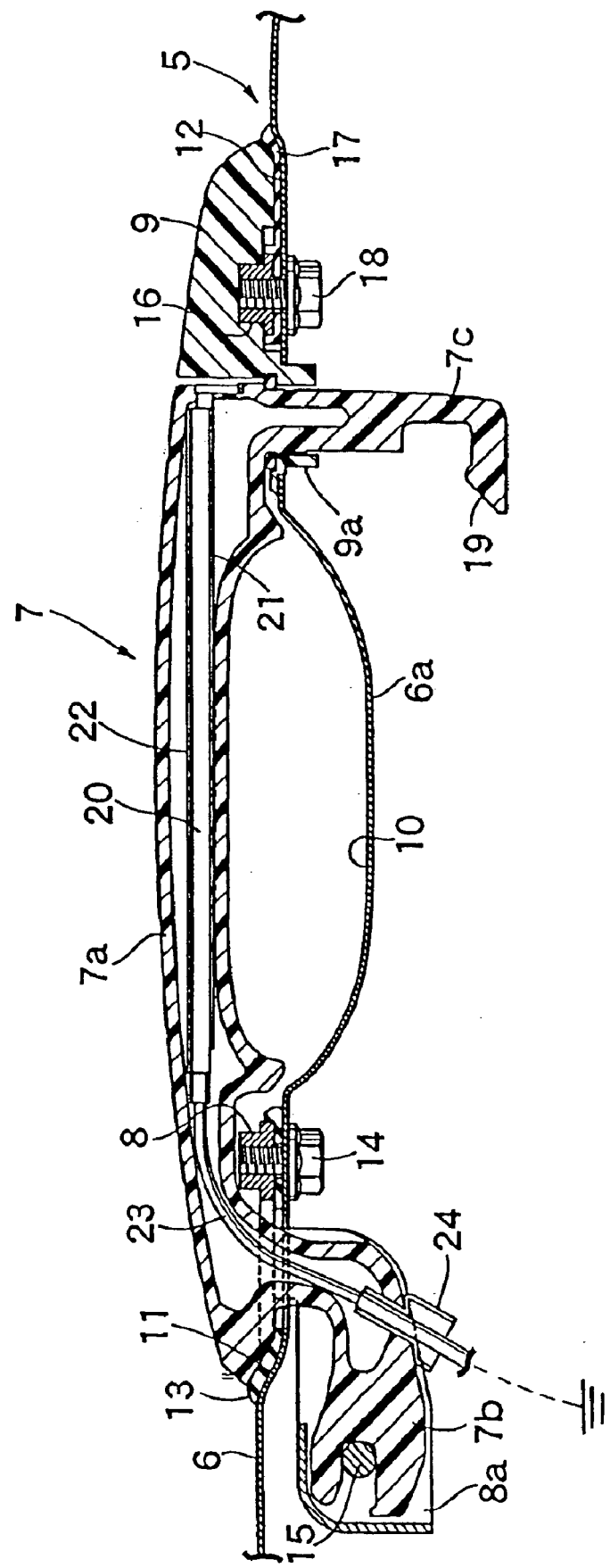

In FIGS. 1 and 2, an outer panel 6 of a side door 5 of, for example, a passenger vehicle is equipped with an outer handle system according to the present invention. The outer handle system includes a handle main body 7 made of a synthetic resin, a first base member 8 made of metal, and a second base member 9 made of a synthetic resin. The handle main body 7 extends in the longitudinal direction of the vehicle (the left to right direction in FIGS. 1 and 2). The first base member 8 is mounted on the outer panel 6 at one end of the handle main body 7. The second base member 9 is mounted on the outer panel 6 at the other end of the handle main body 7.

The handle main body 7 is formed using a synthetic resin and includes a hollow grip part 7a, a support arm 7b, and a guide arm 7c. The grip part 7a extends in the longitudinal direction of the vehicle. The support arm 7b is provided integrally with one end of the grip part 7a, and the guide arm 7c is provided integrally with the other end of the grip part 7a.

Provided in the outer panel 6 is a curved section 6a that protrudes inwardly in order to form a recess 10 for allowing a user's hand to be inserted between the grip part 7a and the outer panel 6. Also provided in the outer panel 6 are first and second mounting seats 11 and 12 at positions on either side of the curved section 6a in the longitudinal direction of the vehicle, the first and second mounting seats 11 and 12 being slightly recessed and corresponding to the opposite ends of the handle main body 7.

The first base member 8 is secured to the first mounting seat 11 by a bolt 14 with a first sheet member 13 made of a synthetic resin disposed between the first mounting seat 11 and the first base member 8. The first base member 8 is provided integrally with a handle support part 8a that passes through the first sheet member 13 and the outer panel 6 and is inserted inside the outer panel 6. The support arm 7b at said one end of the handle main body 7 passes through the first base member 8, the first sheet member 13 and the outer panel 6 and is inserted inside the outer panel 6. The support arm 7b is swingably supported by the handle support part 8a via a support pin 15. That is, said one end of the handle main body 7 is swingably supported in the door outer panel 6 via the first base member 8.

A cylindrical boss 16 is mold-bonded to the second base member 9 made of a synthetic resin. The second base member 9 is secured to the second mounting seat 12 by a bolt 18 that is screwed into the boss 16 with a second sheet member 17 made of a synthetic resin disposed between the second base member 9 and the second mounting seat 12. The second base member 9 is provided integrally with a guide tube 9a that passes through the outer panel 6 and penetrates into the inside of the outer panel 6. The guide arm 7c at said other end of the handle main body 7 is movably inserted through the guide tube 9a. Provided on the extremity of the guide arm 7c is a stopper 19 that engages with the inner end of the guide tube 9a so as to define the limit of outward movement of the guide tube 9a, that is, the limit of swing of the handle main body 7 for the opening operation.

A retaining plate 20 made of a synthetic resin is inserted within the hollow grip part 7a so us to extend in the longitudinal direction of the vehicle. Disposed on the inside of the retaining plate 20, that is, the surface thereof that faces the outer panel 6, is an electrode 21 for detecting a change in the capacitance relative to ground. Disposed on the outside of the retaining plate 20, that is, the surface thereof that faces a direction opposite from the outer panel 6 is a grounded electrostatic Shield plate 22, so as to be housed within the grip part 7a outwardly of the electrode 21. An electrical cord 23 with bundling leads connected to the electrode 21 and the electrostatic shield plate 22, respectively, is guided into the outer panel 6 via a grommet 24 mounted in the support arm 7b of the handle main body 7 and is connected to a around.

The action of this embodiment is explained below. When a vehicle user touches the side or surface of the grip part 7a of the handle main body 7 facing inwardly of the vehicle, the capacitance between ground and the electrode 21 housed within the grip 7a of the handle main body 7 increases in comparison with the case where the inside of the grip part 7a is not touched. By detecting such a change in capacitance it is recognized that the user intends to open the door. Since the grounded electrostatic shield plate 22 is disposed outwardly of the electrode 21 housed in the grip part 7a, the sensitivity of the electrode 21 within the grip part 7a can be made low for the side or surface of the grip part 7a facing outwardly of the vehicle. It is therefore possible to prevent the capacitance between the electrode 21 and ground from increasing when the outside of the grip part 7a is directly touched by a human hand or the outside of the grip part 7a is indirectly touched by a human body via clothes, a glove, etc., thus preventing erroneous recognition of a user's intention to open the door and precluding any possibility that the locked door might be erroneously unlocked.

Consequently, unless a user having the intention of opening the door touches the side or surface of the grip part 7 of the handle main body 7 facing inwardly of the vehicle, the capacitance between the electrode 21 and ground does not increase, thereby correctly recognizing the user's intention for opening the door.

An embodiment of the present invention is explained above, but the present invention is in no way limited by the above-mentioned embodiment and may be modified in a variety of ways without departing from the spirit and scope of the present invention described in the appended claims.

In accordance with the present invention, unless a user having the intention of opening the door touches the side or surface of the grip part provided in the handle main body facing inwardly of the vehicle, the capacitance between the electrode and ground does not increase, thereby correctly recognizing the user's intention of opening the door.

We claim:

1. A vehicle outer handle system comprising:
    a handle main body formed from a synthetic resin and comprising a grip part, one end of the handle main body being swingably supported in a door outer panel;
    an electrode for detecting a change in capacitance, the electrode being housed within the grip part; and
    a grounded electrostatic shield plate disposed outwardly of the electrode so that sensitivity of the electrode is made low for a side of the grip part facing outwardly of the vehicle.

2. The vehicle outer handle system according to claim 1, wherein said grip part is hollow.

3. The vehicle outer handle system according to claim 1, wherein said one end is a longitudinal end of the handle main body.

4. The vehicle outer handle system according to claim 1, wherein said electrostatic shield plate is also housed within said grip part.

5. A vehicle outer handle system comprising:
    a handle main body formed from a synthetic resin and comprising a grip part, one end of the handle main body being swingably supported in a door outer panel;
    an electrode for detecting a change in capacitance, the electrode being housed within the grip part;
    a grounded electrostatic shield plate disposed outwardly of the electrode so that sensitivity of the electrode is made low for a side of the grip part facing outwardly of the vehicle; and
    a retaining member disposed within said grip part, said electrode and said electrostatic shield plate being disposed on opposite surfaces of said retaining member.

6. The vehicle outer handle system according to claim 1, wherein said electrostatic shield plate is disposed between a surface of said grip part facing outwardly of the vehicle and said electrode.

7. An outer handle system for a vehicle door, comprising:
    a handle having an end which pivotally connects to the vehicle door so as to be pivotable relative to an outer panel of the door, and having a grip portion formed of synthetic resin which is engaged by a user's hand for pivoting the handle;
    an electrode disposed within the grip portion of said handle to detect a change of capacitance; and
    a grounded electrostatic shield plate disposed with the grip portion outwardly of the electrode so that sensitivity of the electrode is made low for a side of the grip part facing outwardly of the vehicle.

8. The vehicle outer handle system according to claim 7, wherein said grip portion is hollow.

9. The vehicle outer handle system according to claim 7, wherein said end is a longitudinal end of the handle.

10. The vehicle outer handle system according to claim 7, wherein said electrostatic shield plate is also housed within said grip portion.

11. A vehicle outer handle system for a vehicle door, comprising:
    a handle having an end which pivotally connects to the vehicle door so as to be pivotable relative to an outer panel of the door, and having a grip portion formed of synthetic resin which is engaged by a user's hand for pivoting the handle;
    an electrode disposed within the grip portion of said handle to detect a change of capacitance;
    a grounded electrostatic shield plate disposed with the grip portion outwardly of the electrode so that sensitivity of the electrode is made low for a side of the grip part facing outwardly of the vehicle; and
    a retaining member disposed within said grip portion, said electrode and said electrostatic shield plate being disposed on opposite surfaces of said retaining member.

12. The vehicle outer handle system according to claim 7, wherein said electrostatic shield plate is disposed between a surface of said grip portion facing outwardly of the vehicle and said electrode.

13. A vehicle outer handle system comprising:

handle means for opening a vehicle door;

said handle means including a main body formed from a synthetic resin and having a grip part, a part of the handle main body being swingably supported in an outer panel of the door;

an electrode for detecting a change in capacitance as an indication of a user's intention to open the door, the electrode being housed within the grip part; and means for preventing erroneous recognition of the user's intention of opening the door such that sensitivity of the electrode is made low for a side of the grip part facing outwardly of the vehicle.

14. The vehicle outer handle system according to claim 13, wherein said preventing means includes a grounded electrostatic shield plate disposed with the handle main body outwardly of the electrode.

15. The vehicle outer handle system according to claim 13, wherein said grip part is hollow.

16. The vehicle outer handle system according to claim 14, wherein said electrostatic shield plate is also housed within said grip part.

17. The vehicle outer handle system according to claim 14, further including a retaining member disposed within said grip part, said electrode and said electrostatic shield plate being disposed on opposite surfaces of said retaining member.

* * * * *

UNITED STATES PATENT AND TRADEMARK OFFICE
CERTIFICATE OF CORRECTION

PATENT NO. : 6,883,840 B2
DATED : April 26, 2005
INVENTOR(S) : Masahiko Sueyoshi et al.

It is certified that error appears in the above-identified patent and that said Letters Patent is hereby corrected as shown below:

Title page,
Item [56], References Cited, FOREIGN PATENT DOCUMENTS, change
"DE    3621592    *    2/1987" to -- DE    3621592    *    7/1987 --; and
"DE    4435894    *    11/1996" to -- DE    4435894    *    4/1996 --.

Column 3,
Line 10, change "so us to extend" to -- so as to extend --.
Line 16, change "electrostatic Shield plate" to -- electrostatic shield plate --.
Line 22, change "connected to a around." to -- connected to a ground. --.
Line 45, change "grip part 7" to -- grip part 7*a* --.

Signed and Sealed this

First Day of November, 2005

JON W. DUDAS
*Director of the United States Patent and Trademark Office*